US006925025B2

(12) United States Patent
Deng et al.

(10) Patent No.: US 6,925,025 B2
(45) Date of Patent: Aug. 2, 2005

(54) SRAM DEVICE AND A METHOD OF POWERING-DOWN THE SAME

(75) Inventors: Xiaowei Deng, Plano, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 107 days.

(21) Appl. No.: 10/701,669

(22) Filed: Nov. 5, 2003

(65) Prior Publication Data

US 2005/0094474 A1 May 5, 2005

(51) Int. Cl.[7] .................................................. G11C 7/00
(52) U.S. Cl. ........................ 365/226; 365/229; 365/227
(58) Field of Search ................................ 365/226, 229, 365/227, 230.06

(56) References Cited

U.S. PATENT DOCUMENTS 6,341,098 B2 * 1/2002 Yamagata et al. .......... 365/226

* cited by examiner

Primary Examiner—David Lam
(74) Attorney, Agent, or Firm—Rose Alyssa Keagy; W. James Brady, III; Frederick J. Telecky, Jr.

(57) ABSTRACT

An SRAM device and a method of powering-down an SRAM device. In one embodiment, the SRAM device includes (1) an SRAM array, (2) peripheral circuitry coupled to the SRAM array having voltage domains defined by a boundary and (3) a power-down voltage controller coupled to the SRAM array and the peripheral circuitry that separately regulates voltages of the SRAM array and the peripheral circuitry to reduce leakage current of the SRAM array and the peripheral circuitry at the boundary during a sleep mode.

20 Claims, 2 Drawing Sheets

SRAM DEVICE AND A METHOD OF POWERING-DOWN THE SAME

CROSS-REFERENCE TO RELATED APPLICATIONS

This application is related to patent application Ser. No. 10/337,069 filed Jan. 6, 2003 and entitled "Bit Line Control For Low Power In Standby"; patent application Ser. No. 10/349,277 filed Jan. 22, 2003 and entitled "Low Leakage SRAM Scheme"; patent application Ser. No. 10/039,124 filed Dec. 31, 2001 and entitled "Method and Apparatus for Reducing Leakage Current in an SRAM Array"; patent application Ser. No. 10/185,380 filed Jun. 28, 2002 and entitled "Memory Array and Wordline Driver Supply Voltage Differential in Standby"; patent application Ser. No. 10/618,473 filed Jul. 11, 2003 and entitled "System for Reducing Row Periphery Power Consumption in Memory Devices"; U.S. Pat. No. 5,596,286 issued Jan. 21, 1997 and entitled "Current Limiting Devices To Reduce Leakage, Photo, or Stand-by Current in an Integrated Circuit"; and U.S. Pat. No. 5,615,162 issued Mar. 25, 1997 and entitled "Selective Power To Memory". With their mention in this section, these patents and patent applications are not admitted to be prior art with respect to the present invention.

TECHNICAL FIELD OF THE INVENTION

The present invention is directed, in general, to memory devices and, more specifically, to a Static Random-Access Memory (SRAM) device employing a power-down voltage controller for controlling power during sleep mode and a method of powering-down the same.

BACKGROUND OF THE INVENTION

Different types of memory are used in electronic apparatus for various purposes. Read only memory (ROM) and random-access memory (RAM) are two such types of memory commonly used within computers for different memory functions. ROM retains its stored data when power is switched off and therefore is often employed to store programs that are needed for powering-up an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refresh, making it faster. These attributes make SRAM devices particularly desirable for portable equipment, such as laptop computers and personal digital assistants (PDAs).

A typical SRAM device includes a matrix of addressable memory cells arranged in columns and rows. A typical SRAM cell includes two access transistors and a flip-flop formed with two cross-coupled inverters, each inverter having a pull-down (driver) and a pull-up (load) transistor. The gates of the access transistors in each row are connected to a word line and the sources of each of the access transistors in each column are connected to either one of a bit line pair, B or $\overline{B}$. Peripheral circuitry associated with the rows (or word lines) and peripheral circuitry associated with the columns (or bit lines) facilitate reading data from, and writing data to, the SRAM cells.

Generally, to read data from an SRAM cell, a word line driver may activate a word line according to an address decoded by a row decoder and received via a signal path that typically includes an address bus connected to the SRAM device. The access transistors turn on and connect the outputs of the flip-flop to the bit line pair sending signals representing the data in the SRAM cell to a sense amplifier coupled to the bit line pair. The sense amplifier amplifies the potential difference on the bit line pair. Data from the sense amplifier is output to the external circuitry of the associated electronic apparatus optionally through a buffer. Essentially, data is written to each SRAM cell in the opposite way.

As mentioned above, to retain the data written to the matrix of SRAM cells, or memory array, each SRAM cell must have a continuous supply of power. SRAM devices, however, are often employed within battery-powered wireless apparatus where power consumption is an important design parameter. Accordingly, wireless apparatus may be transitioned from an active mode to a standby mode of lower power consumption. As transistor size continues to diminish (e.g., 90 nm transistors), current leakage may be unacceptably high even during standby mode, requiring a transition to a still lower power consumption level, sleep mode, to conserve power adequately. Current leakage is often a combination of subthreshold leakage current, gate leakage current, and source/drain-to-body diode leakage current from the SRAM cell transistors. To reduce the current leakage, the battery-powered wireless apparatus may power-down the row and column circuitry associated with the memory array and enter the sleep mode while still supplying sufficient voltage across the memory array to retain data.

Presently, various powering-down designs for the peripheral circuitry are used. Typically, each of the various designs seek a balance among complexity, reliability and power consumption during the sleep mode. To achieve minimum power during the sleep mode, all of the periphery circuitry may be powered-down while sufficient supply voltage across the memory array is maintained. Additionally, powering-down designs may also strive to reduce voltage fluctuations, or "wiggling," of word lines caused by the peripheral circuitry while transitioning from standby to sleep mode to prevent possible corruption of the data. Once the sleep mode has been entered, additional problems may be encountered. For example, currents may leak from the powered memory array to the peripheral circuitry associated with the columns that is not powered (shut down).

One existing design to minimize memory array leakage during sleep mode calls for lowering the memory array high voltage supply, $V_{DDA}$. Additionally, a well voltage of the memory array transistors, more specifically $V_{nwell}$, may be set higher than the $V_{DDA}$ to reduce memory array leakage current. Other leakage reduction designs are also employed.

For example, the memory array low voltage supply, $V_{SSA}$, can be raised and the bit lines floated (at a floating voltage typically near the raised $V_{SSA}$ level) or clamped at the raised $V_{SSA}$ level while the word lines are maintained at about the $V_{SSA}$ level. To float the bit lines, main column peripheral circuits can be isolated from the bit lines by inserting isolation transistors in series with pre-charge circuitry, write circuitry and column multiplexer for each bit line. Preferably, the word line does not go much higher above the raised $V_{SSA}$ and the bit lines do not go much below the raised $V_{SSA}$.

As the array leakage is minimized with the above aggressive approaches, periphery leakage can start to dominate the SRAM leakage during sleep mode at standard periphery bias conditions. A significant amount of gate and subthreshold current leakage among some of the large column periphery transistors whose gate, drain, and source are at different potentials (e.g., 0.8 volts versus 0.0 volts) may still occur. For example, existing SRAM devices often include a word line keeper in conjunction with a header and a footer for the word line driver that results in significant leakage through the gate of the word line driver due to the associated large gate area along a boundary of the voltage domains created by the header and the footer.

Accordingly, what is needed in the art is an improved low-power SRAM device that has minimum current leakage during sleep mode. More specifically, what is needed is a SRAM device that reduces leakage current of the SRAM array and the peripheral circuitry while in a sleep mode.

SUMMARY OF THE INVENTION

To address the above-discussed deficiencies of the prior art, the present invention provides an SRAM device and a method of powering-down an SRAM device. In one embodiment, the SRAM device includes (1) an SRAM array, (2) peripheral circuitry coupled to the SRAM array having voltage domains defined by a boundary and (3) a power-down voltage controller coupled to the SRAM array and the peripheral circuitry that separately regulates voltages of the SRAM array and the peripheral circuitry to reduce leakage current of the SRAM array and the peripheral circuitry at the boundary during a sleep mode.

The present invention, therefore, introduces an SRAM device that includes the power-down voltage controller that can advantageously control voltages for the peripheral circuitry and the SRAM array to reduce current leakage during sleep mode. Additionally, the power-down voltage controller may allow the SRAM device to be transitioned from standby to sleep mode without false read/writes. The power-down voltage controller may employ a header or footer to control voltages, whether clamped or floating, of the SRAM device. For purpose of the present invention, a header is a transistor positioned between a high voltage supply, $V_{DD}$, and selected circuitry while a footer is a transistor positioned between a low voltage supply, $V_{SS}$, and the selected circuitry.

The power-down voltage controller may include a header/footer pair for the peripheral circuitry and an additional header/footer pair for the SRAM array. In some embodiments, the power-down voltage controller may include separate header/footer pairs for column peripheral circuitry and row peripheral circuitry of the peripheral circuitry. Additionally, the power-down voltage controller may employ a single footer for the peripheral circuitry and the SRAM array.

The power-down voltage controller may employ at least one header and footer to establish the boundary in the SRAM device. The boundary is an interface that occurs between two different voltage domains and is advantageously selected to reduce current leakage and therefore reduce power consumption while in the sleep mode. In other words, the boundary may be a division employed to control power and reduce current leakage. The current leakage may be primarily based on gate tunneling leakage from components at the boundary. The boundary, therefore, is preferably defined at components having a small width. The small width may minimize the gate tunneling and subthreshold leakage of components along the boundary since gate current is approximately proportional to gate area and subthreshold current is approximately proportional to width of the transistor.

In another embodiment, the present invention provides a method of powering-down an SRAM device including (1) transmitting an initial power-down signal to a keeper associated with word lines coupled to a word line driver of the peripheral circuitry, (2) transmitting the initial power-down signal to a power-down voltage controller coupled to the peripheral circuitry and the SRAM array and (3)transmitting a subsequent power-down signal to the power-down voltage controller.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Figure 1:
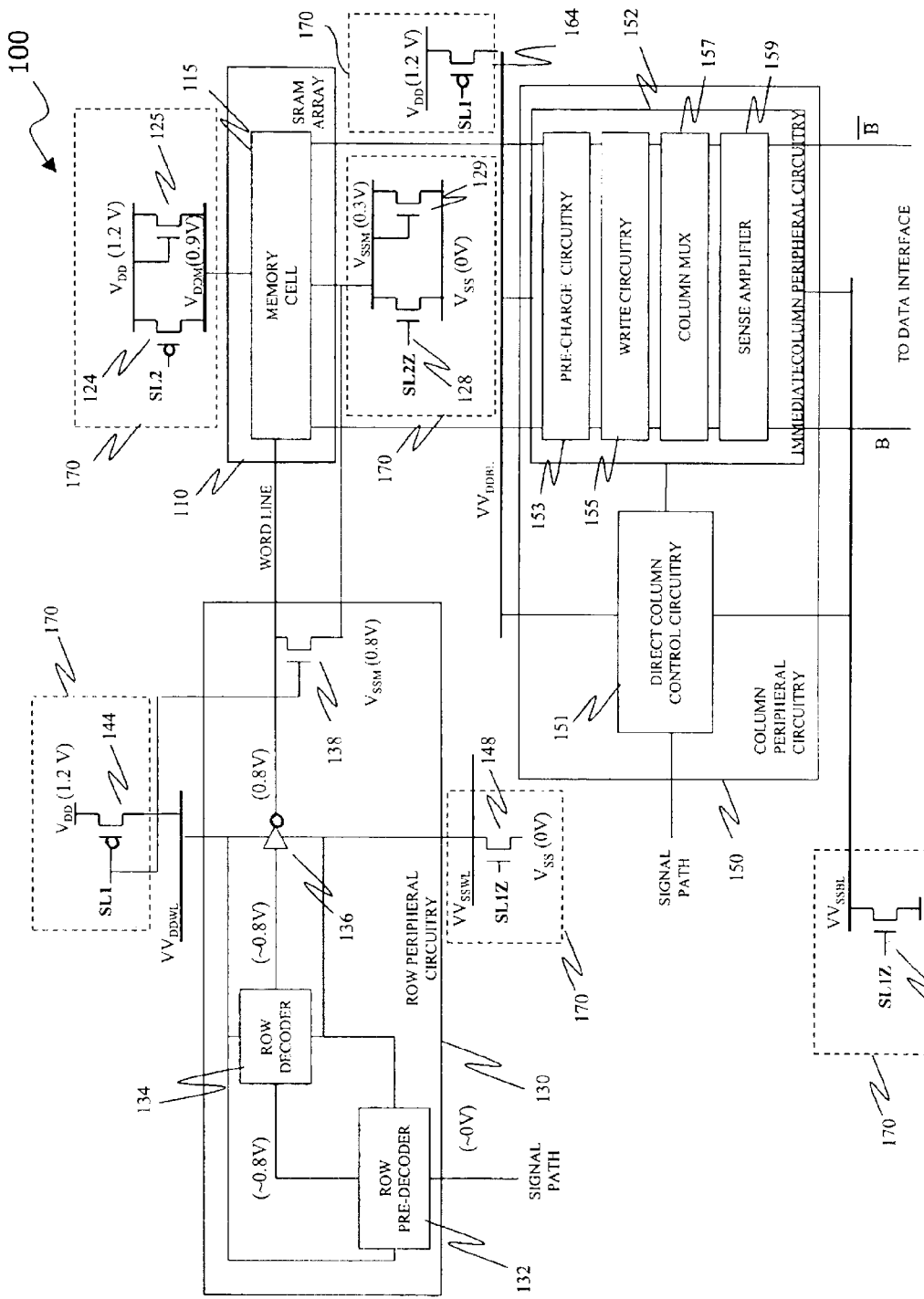
FIG. 1 illustrates a circuit diagram of an embodiment of an SRAM device constructed according to the principles of the present invention.

Referring initially to FIG. 1, illustrated is a circuit diagram of an embodiment of an SRAM device 100 constructed according to the principles of the present invention. The SRAM device 100 includes an SRAM array 110, row peripheral circuitry 130, column peripheral circuitry 150 and a power-down voltage controller 170. Typically, the SRAM array 110 includes multiple memory cells organized in a matrix of columns and rows and correspondingly multiple word lines and bit lines. For ease of discussion, however, only a single memory cell 115 of the SRAM array 110 is illustrated. Accordingly, a single word line and bit line pair are illustrated and discussed along with the associated row and column peripheral circuitry 130, 150.

The row peripheral circuitry 130 includes a row pre-decoder 132, a row decoder 134, a word line driver 136 and a keeper 138. The column peripheral circuitry 150 includes direct column control circuitry 151 and immediate column peripheral circuitry 152 having pre-charge circuitry 153, write circuitry 155, a column multiplexer 157 and a sense amplifier 159. The SRAM device 100 also includes the power-down voltage controller 170 that may be employed to separately control power to the SRAM array 110, the row peripheral circuitry 130, and the column peripheral circuitry 150 and will be discussed in more detail below.

The SRAM device 100 may be a memory component for an associated microprocessor, digital signal processor (DSP), application-specific integrated circuit (ASIC) or larger electronic apparatus. In some embodiments, more than one SRAM device 100 may comprise the memory component. Typically, signal paths and a data interface of the associated apparatus may be coupled to the SRAM device 100 to send address information and retrieve/send data for reading/writing the data from/to specific memory cells of the SRAM array 110. One skilled in the art will understand coupling of the SRAM device 100 to the associated apparatus.

The memory cell 115 of the SRAM array 110 has a unique address for writing and reading the data. The memory cell 115 may employ MOSFETs and a flip-flop to store the data as a one (high) or a zero (low). In the illustrated embodiment, the SRAM array 110 may have 256 columns and 256 rows of memory cells. One skilled in the pertinent art, however, will understand that the size of the SRAM array 110 may vary in different implementations.

The reading and writing of the data from and to the SRAM array 110 may be controlled by the row peripheral circuitry 130 and the column peripheral circuitry 150. The row peripheral circuitry 130 may control activating a word line associated with one of the rows. The word line driver 136 may activate the word line for reading or writing based on an address signal received via a row signal path and decoded by the row pre-decoder 132 and the row decoder 134.

The column peripheral circuitry 150 controls selecting the columns of the SRAM array 110 for reading and writing. The direct column control circuitry 151 may include column address decoders for determining memory column locations within the SRAM array 110 and control circuitry for determining between writing or reading the data. The pre-charge circuitry 153, the write circuitry 155, the column multiplexer 157 and the sense amplifier 159 of the immediate column peripheral circuitry 152 may facilitate reading and writing data from/to the correct column address that has been decoded. As with the row peripheral circuitry 130, the column peripheral circuitry 150 may also include additional components that facilitate writing and reading the data that are not illustrated or discussed herein.

Unlike conventional SRAM devices that employ a single header/footer pair to control power to an entire SRAM device, the SRAM device 100 may employ the power-down voltage controller 170 that allows separate power control for the SRAM array 110, the row peripheral circuitry 130 and the column peripheral circuitry 150. The separate power control proves beneficial during powering-down of the SRAM device 100 from standby to sleep mode to prevent errant write signals and allow power supply separation of the SRAM array 110 from the row peripheral circuitry 130 and the column peripheral circuitry 150 during sleep mode to reduce current leakage. The power-down voltage controller 170 may include multiple headers and footers to supply voltages to the SRAM device 100 during sleep mode. In other embodiments, the power-down voltage controller 170 can include other components that may control and provide supply voltages for the SRAM device 100. For example, the power-down voltage controller 170 may include a diode-bridged header or a low drop-out (LDO) voltage regulator to regulate a high operating voltage to the SRAM array 110, $V_{DDM}$, and a low operating voltage supplied to the SRAM array 110, $V_{SSM}$. The diode-bridged header may be coupled to $V_{DD}$ or $V_{SS}$ and the LDO may be referenced to $V_{DDM}$ to regulate the $V_{SSM}$. A diode-bridged header may be a transistor coupled in parallel with a diode. Various methods can be used to lower the $V_{DDM}$ or raise the $V_{SSM}$. Examples include a diode, an LDO, or a direct supply from a source outside of the SRAM device 100. For simplicity, the diode is used and discussed in FIG. 1.

As illustrated in FIG. 1, the multiple headers and footers of the power-down voltage controller 170 may include a diode-bridged header 124, a diode-bridged footer 128, a row header 144, a row footer 148, a column header 164 and a column footer 168. Each of the headers may be a p-channel MOSFET and each of the footers may be a n-channel MOSFET to facilitate pulling-up and pulling-down of associated voltages. The multiple headers and footers may be controlled by initial and subsequent power-down signals represented by SL1 and SL2 in FIG. 1. The power-down signals may be sent from a microprocessor associated with the SRAM device 100.

The diode-bridged header 124 and the diode-bridged footer 128 may be coupled in parallel to a header-diode 125 and a footer-diode 129, respectively. When entering sleep mode, the diode-bridged header 124, is turned off and the high operating voltage supplied to the SRAM array 110, $V_{DDM}$, decreases from $V_{DD}$, which may be approximately 1.2 volts, to a voltage having a value equivalent to $V_{DD}$ minus the voltage drop across the header-diode 125. Additionally, the diode-bridged footer 128 is turned off and the low operating voltage supplied to the SRAM array 110, $V_{SSM}$, increases from $V_{SS}$ to a voltage having a value equivalent to $V_{SS}$ plus the voltage drop across the footer-diode 129. As illustrated, $V_{DDM}$ and $V_{SSM}$ may have values at approximately 0.9 volts and 0.3 volts, respectively, in the sleep mode. Additionally, an n-well of the SRAM array 110 may be held at approximately 1.2 volts. Thus, while in the sleep mode, the data in the SRAM array 110 may be maintained by the diode-limited voltages $V_{DDM}$ and $V_{SSM}$ with the n-well at 1.2 volts.

In an alternative embodiment, $V_{DDM}$ remains fixed for the SRAM array 110 during powering-down and at sleep mode while the $V_{SSM}$ for the SRAM array 110 is raised. In this alternative embodiment, an n-well of the SRAM array 110 may be biased from the 1.2 volts at standby to approximately 1.8 volts. The power-down voltage controller 170 may be configured to provide the n-well bias.

The row header 144 and the row footer 148 are also turned off when entering the sleep mode providing isolation of the row peripheral circuitry 130 from $V_{SS}$ and $V_{DD}$ during sleep mode. During power-down, the keeper 138 is turned on to insure the word line is biased low. Though operating the keeper 138 results in some power loss due to gate current, biasing the word line low during powering-down and sleep mode deters fluctuations in the word line voltage and assists the SRAM array 110 in maintaining the stored data while at the sleep mode voltages for $V_{DDM}$ and $V_{SSM}$. Preferably, the word line is biased low, or off, before the SRAM array 110 voltages $V_{DDM}$ and $V_{SSM}$ are switched to the values for sleep mode.

The row header 144 and the row footer 148 may establish a row boundary at the row pre-decoder 132 by isolating the row peripheral circuitry 130 from $V_{DD}$ and $V_{SS}$ at voltages designated as virtual high and low supply voltages for the word line driver 136, $VV_{DDWL}$, $VV_{SSWL}$. Through the keeper 138, the isolated row peripheral circuitry 130 is biased at the low SRAM array supply voltage $V_{SSM}$ during sleep mode and transition thereto. The row boundary, therefore, may be established at the row pre-decoder 132 which reduces the gate leakage of the word line driver 136. Typically, the row pre-decoder 132 may be selected as a preferable row boundary location based on having a small input device compared to other components of the row peripheral circuitry 130. Of course, the row boundary may be located at other components of the row peripheral circuitry 130 that have a smaller input device resulting in a reduced gate leakage at the row boundary.

In an alternative embodiment, the row peripheral circuitry 130 may not employ the row header 144 and the row footer 148. Instead, the word line driver of the row peripheral circuitry 130 may simply employ a separate header from the SRAM array 110 and the column peripheral circuitry 150 and share a footer with the SRAM array 110. In this embodiment, the keeper 138 may be coupled to a drain of the SRAM array footer to bias the word line low. A row boundary, therefore, may be established between the word line driver 136 and other components of the row peripheral circuitry 130. The row boundary, however, may result in gate tunneling leakage (current leakage from a source and drain to a gate) of the word line driver 136, specifically a large word line driver, that provides a significant contribution to leakage of the row peripheral circuitry 130.

In another alternative embodiment, the row header 144 and the row footer 148 may isolate the word line driver 136 while an additional header and footer pair, a decoder header and footer, may be employed to isolate remaining components of the row peripheral circuitry 130. In this embodiment, the row pre-decoders 132 and the row decoders 134 may float at a voltage level such that combined gate leakage and diode leakage are minimized for the row peripheral circuitry 130.

The power-down voltage controller 170, therefore, may include a combination of headers and footers. In some embodiments, a separate header or footer may not be employed for the row peripheral circuitry 130 and the column peripheral circuitry 150. Some of the headers or footers of the power-down voltage controller 170 may be shared. For example, the row header 144 may also be employed as the column header 164. Additionally, the row footer 148 may be employed as the column footer 168 or footer for the SRAM array 110. One skilled in the art will understand that a combination of headers and footers may be employed to provide voltages for the SRAM device 100.

The column header 164 and the column footer 168 are also turned off during power-down to isolate the column peripheral circuitry 150 from $V_{DD}$ and $V_{SS}$. A column boundary, therefore, may be established at the sense amplifier 159 and at the direct column control circuitry 151. Of course, the column boundary may be established at a component having a smaller input than other components of the column peripheral circuitry 150. The voltage of the column peripheral circuitry 150, therefore, may float between $V_{DD}$ and $V_{SS}$ during sleep mode. During the sleep mode, the column peripheral circuitry 150 may float at virtual voltages that minimizes leakage current on the bit lines. The virtual high and low supply voltage associated with the bit lines may be designated $VV_{DDBL}$ and $VV_{SSBL}$. Typically, $VV_{SSBL}$ may approach $V_{SSM}$ having, for example, a value of approximately 0.4 volts.

The column header 164 and the column footer 168 may not need sizing proportional to the number of column sections, such as pre-charge circuitry 153, write circuitry 155, column mux 157, and sense amplifier 159, since different sections of the column peripheral circuitry 150 along the column signal path switch at different times during active mode. Preferably, the column footer 168 and the diode-bridged footer 128 may be shared. This may save the total footer since the column peripheral circuitry 150 and the SRAM array 110 do not switch at the same time during active mode, but may also prevent corruption of the data due to the bit lines going below $V_{SSM}$ during the power-down/up transitions since $VV_{SSBL}$ may be equivalent to $V_{SSM}$.

Figure 2:
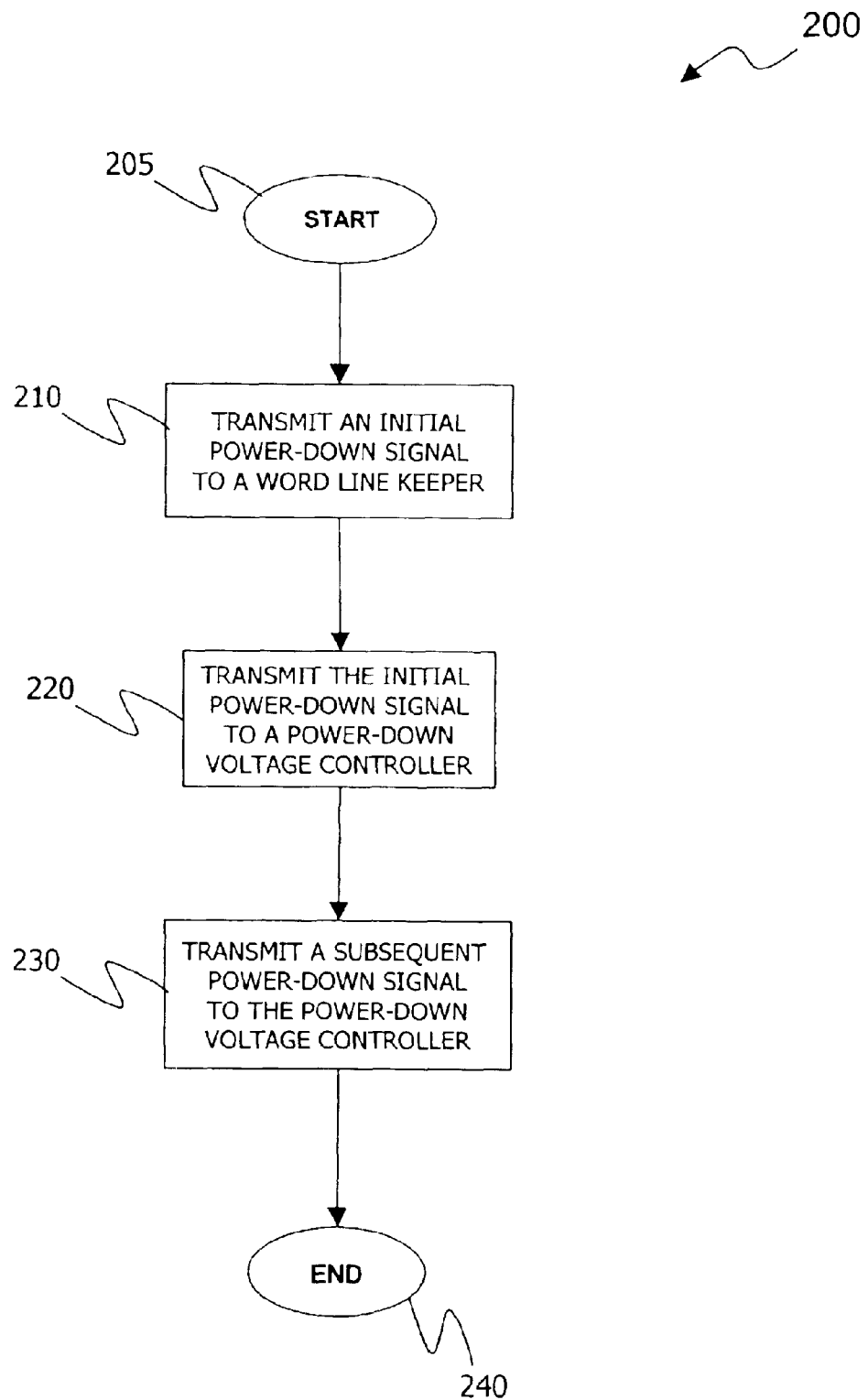
FIG. 2 illustrates an embodiment of a method of powering-down an SRAM device carried out according to the principals of the present invention.

Turning now to FIG. 2, illustrated is an embodiment of a method of powering-down an SRAM, generally designated 200, carried out according to the principals of the present invention. The method begins in a step 205, wherein it is desired to enter a sleep mode.

After beginning, an initial power-down signal is transmitted to a keeper in a step 210. The initial power-down signal may turn on the keeper to bias low or hold low an associated word line coupled to a word line driver. In the illustrated embodiment, the keeper is a single MOSFET.

After transmitting the initial power-down signal to the keeper, the initial power-down signal is transmitted to a power-down voltage controller in a step 220. The initial power-down signal may be transmitted to the power-down voltage controller to turn off a row header and footer employed thereof. The row header and the row footer may be associated with row peripheral circuitry having the word line driver. The row peripheral circuitry may further include a row pre-decoder coupled to a row decoder, with the row decoder coupled to the word line driver. Turning off the row header and footer may establish a boundary at the row pre-decoder. The row header may be a p-channel MOSFET and the row footer may be an n-channel MOSFET. The initial power-down signal may be sent from a microprocessor associated with the SRAM device. In one embodiment, the power-down voltage controller may send the initial power-down signal to an additional header and footer, a decoder header and footer, employed thereof and associated with a row decoder of the row peripheral circuitry. In this embodiment, the decoder header and footer may float the row decoder and other components of the row peripheral circuitry at a voltage level to reduce gate leakage and diode leakage.

Additionally, the power-down voltage controller may employ the initial power-down signal to turn off a column header and a column footer. The column header and the column footer may be associated with column peripheral circuitry having a sense amplifier and direct column control circuitry. Turning off the column header and footer may establish a boundary at the sense amplifier and the direct column control circuitry. The column header may be a p-channel MOSFET and the column footer may be an n-channel MOSFET. Turning off the column header and footer may float the column peripheral circuitry to a voltage that reduces current leakage from the SRAM array to the column peripheral circuitry during sleep mode. In some embodiments, bit lines coupled to the column peripheral circuitry may float at a voltage of, for example, approximately 0.1 volts above $V_{SSM}$ during the sleep mode.

The power-down voltage controller may employ the initial power-down signal to control a single header associated with the row and column peripheral circuitry. Additionally, the power-down voltage controller may employ a single footer that is shared to control the SRAM array and the peripheral circuitry. The single header for the peripheral circuitry, however, is not shared with a header for the SRAM array.

After transmitting an initial power-down signal to the power-down voltage controller, a subsequent power-down signal is transmitted to the power-down voltage controller in a step 230. The power-down voltage controller may employ the subsequent power-down signal to turn off a header, such as, diode-bridged header and a footer, such as, a diode-bridged footer of the power-down voltage controller. The diode-bridged header and the diode-bridged footer may be coupled to an SRAM array coupled to the row peripheral circuitry by the word lines and coupled to the column peripheral circuitry by the bit lines. By turning off the diode-bridged header and the diode-bridged footer, the power-down voltage controller may provide reduced voltages for the SRAM array during sleep mode. The reduced voltages across the SRAM array may be the difference between $V_{DD}$ minus the voltage drop across a parallel-coupled diode and $V_{SS}$ plus the voltage drop across a parallel-coupled diode. The reduced voltages across the SRAM array is sufficient to retain memory and reduces power consumption. After transmitting the subsequent power-down signal, the method 200 ends in a step 240.

While the methods disclosed herein have been described and shown with reference to particular steps performed in a particular order, it will be understood that these steps may be combined, subdivided or reordered to form an equivalent method without departing from the teachings of the present invention. Accordingly, unless specifically indicated herein, the order and/or the grouping of the steps are not limitations of the present invention.

Although the present invention has been described in detail, those skilled in the art should understand that they can make various changes, substitutions and alterations herein without departing from the spirit and scope of the invention in its broadest form.

What is claimed is:

1. An SRAM device, comprising:
    an SRAM array;
    peripheral circuitry coupled to said SRAM array having voltage domains defined by a boundary; and
    a power-down voltage controller coupled to said SRAM array and said peripheral circuitry that separately regulates voltages of said SRAM array and said peripheral circuitry to reduce leakage current of said SRAM array and said peripheral circuitry at said boundary during a sleep mode.

2. The SRAM device as recited in claim 1 wherein said power-down voltage controller raises a low operating voltage of said SRAM array and sets bitlines of said peripheral circuitry at about said raised low operating voltage.

3. The SRAM device as recited in claim 1 wherein said power-down voltage controller sets said boundary at a row decoder of said peripheral circuitry.

4. The SRAM device as recited in claim 1 wherein said power-down voltage controller sets said boundary at a row pre-decoder of said peripheral circuitry.

5. The SRAM device as recited in claim 1 wherein said power-down voltage controller sets said boundary at a sense amplifier of said peripheral circuitry.

6. The SRAM device as recited in claim 1 wherein said power-down voltage controller comprises a decoder header and a decoder footer coupled to said peripheral circuitry.

7. The SRAM device as recited in claim 1 wherein said power-down voltage controller comprises a column header and a column footer coupled to said peripheral circuitry.

8. The SRAM device as recited in claim 1 wherein said power-down voltage controller shares a footer between said SRAM array and said peripheral circuitry.

9. The SRAM device as recited in claim 1 wherein said power-down voltage controller employs a single header for said peripheral circuitry.

10. The SRAM device as recited in claim 1 wherein said peripheral circuitry includes row peripheral circuitry and column peripheral circuitry and a row boundary is established at a first component having a smaller input device than other components of said row peripheral circuitry and a column boundary is established at a second component having a smaller input than other components of said column peripheral circuitry.

11. A method of powering-down an SRAM device having a SRAM array and peripheral circuitry with voltage domains defined by a boundary, comprising:
    transmitting an initial power-down signal to a keeper associated with word lines coupled to a word line driver of said peripheral circuitry;
    transmitting said initial power-down signal to a power-down voltage controller coupled to said peripheral circuitry and said SRAM array; and
    transmitting a subsequent power-down signal to said power-down voltage controller.

12. The method as recited in claim 11 further comprising raising a low operating voltage of said SRAM array and setting bitlines of said peripheral circuitry at about said raised low operating voltage.

13. The method as recited in claim 11 wherein said initial power-down signal is transmitted to a row header and a column header of said power-down voltage controller and said subsequent power-down signal is transmitted to a diode-bridged header and a diode-bridged footer of said power-down voltage controller.

14. The method as recited in claim 13 further comprising transmitting said initial power-down signal to a row footer of said power-down voltage controller.

15. The method as recited in claim 13 further comprising transmitting said initial power-down signal to a column footer of said power-down voltage controller.

16. The method as recited in claim 11 wherein said initial power-down signal is transmitted to a header of said power-down voltage controller associated with said peripheral circuitry and said subsequent power-down signal is transmitted to a diode-bridged header and a diode-bridged footer of said power-down voltage controller.

17. The method as recited in claim 11 wherein said power-down voltage controller sets said boundary at a row decoder or a row pre-decoder of said peripheral circuitry.

18. The method as recited in claim 11 wherein said power-down voltage controller sets said boundary at a sense amplifier of said peripheral circuitry.

19. The method as recited in claim 11 further comprising biasing an n-well of said SRAM array with a voltage higher than a high operating voltage of said SRAM array.

20. The method as recited in claim 11 wherein said peripheral circuitry includes row peripheral circuitry and column peripheral circuitry and said power-down voltage controller establishes a row boundary at a first component having a smaller input device than other components of said row peripheral circuitry and establishes a column boundary at a second component having a smaller input than other components of said column peripheral circuitry.

* * * * *